United States Patent [19]
Lee et al.

[11] Patent Number: 6,050,832
[45] Date of Patent: Apr. 18, 2000

[54] CHIP AND BOARD STRESS RELIEF INTERPOSER

[75] Inventors: Michael Guang-Tzong Lee, San Jose; Solomon I. Beilin, San Carlos; Wen-chou Vincent Wang, Cupertino, all of Calif.

[73] Assignee: Fujitsu Limited, Japan

[21] Appl. No.: 09/130,871

[22] Filed: Aug. 7, 1998

[51] Int. Cl.[7] .............................. H01R 4/58; H01R 9/09; H01R 1/00
[52] U.S. Cl. ............................................... 439/91; 439/66
[58] Field of Search .................. 439/91, 66, 71, 439/67, 591; 174/261; 324/757

[56] References Cited

U.S. PATENT DOCUMENTS

| | | |
|---|---|---|
| 4,413,308 | 11/1983 | Brown . |
| 4,581,680 | 4/1986 | Garner . |
| 4,641,222 | 2/1987 | Derfiny et al. . |
| 4,707,657 | 11/1987 | Boegh-Peterson .................. 324/158 F |
| 5,077,598 | 12/1991 | Bartelink . |
| 5,137,461 | 8/1992 | Bindra et al. .............................. 439/74 |
| 5,148,266 | 9/1992 | Khandros et al. . |
| 5,258,330 | 11/1993 | Khandros et al. . |
| 5,352,926 | 10/1994 | Andrews . |
| 5,367,435 | 11/1994 | Andros et al. . |
| 5,369,551 | 11/1994 | Gore et al. . |
| 5,414,298 | 5/1995 | Grube et al. . |
| 5,435,732 | 7/1995 | Angulas et al. .......................... 439/67 |
| 5,450,290 | 9/1995 | Boyko et al. . |
| 5,451,720 | 9/1995 | Estes et al. . |
| 5,453,580 | 9/1995 | Franke et al. . |
| 5,473,120 | 12/1995 | Ito et al. .................................. 174/264 |
| 5,477,082 | 12/1995 | Buckley, III et al. . |
| 5,477,933 | 12/1995 | Nguyen . |
| 5,483,421 | 1/1996 | Gedney et al. . |
| 5,491,303 | 2/1996 | Weiss . |
| 5,509,815 | 4/1996 | Jin et al. ..................................... 439/91 |
| 5,586,010 | 12/1996 | Murtuza et al. . |
| 5,598,033 | 1/1997 | Behlen et al. . |
| 5,690,270 | 11/1997 | Gore . |
| 5,700,549 | 12/1997 | Garant et al. . |
| 5,738,531 | 4/1998 | Beaman et al. ............................ 439/71 |
| 5,800,184 | 9/1998 | Lopergolo et al. ........................ 439/66 |
| 5,829,988 | 11/1998 | McMillan et al. ......................... 439/70 |
| 5,880,890 | 3/1999 | Desai et al. ............................. 324/757 |

*Primary Examiner*—Steven L. Stephan
*Assistant Examiner*—Chandrika Prasad
*Attorney, Agent, or Firm*—Coudert Brothers

[57] ABSTRACT

An interposer structure permits a differential transverse displacement of contact pads on opposite sides of the interposer to reduce thermal stresses when the interposer is bonded to contact pads of a chip and a substrate with different thermal coefficients of expansion. The effective elasticity of the interposer between top and bottom contact pads of the interposer is facilitated by perforations which define flap-like regions. A flexible trace couples top contact pads to bottom contact pads through a via while permitting substantial transverse relative displacement of the top and bottom contact pads in flap-like regions.

17 Claims, 4 Drawing Sheets

CHIP AND BOARD STRESS RELIEF INTERPOSER

FIELD OF THE INVENTION

This invention is generally related to the field of semiconductor device packaging, and more particularly to flip chip bonding.

BACKGROUND OF THE INVENTION

Flip chip bonding is a technique in which connections are made between a semiconductor chip and a header. Typically, bead-like projections (conductive bumps) are deposited as terminals on one face of the chip, which is then registered and bonded with header terminals disposed on a substrate module. The substrate module is commonly comprised of a ceramic material, although there is increasing interest in substrates comprised of other materials, such as plastics.

Flip chip bonding provides many advantages compared with making connections to a ceramic header using wire-bonding techniques. These advantages include a reduction in interconnection lengths; a smaller package footprint; and a lower package profile compared with conventional wire bonding techniques. Additionally, flip chip bonding techniques may permit an increased number of input/output interconnections to a chip. The flip chip bonding technique has the potential to provide connections distributed throughout the entire area of a chip with the potential number of connections for a fixed chip size being primarily limited by how densely separate solder connections can be reliably made to contact pads on the chip. In contrast, the number of input/output connections possible with conventional wire bonding is limited by how closely wire bonds can be made along the periphery of a chip.

One common flip chip bonding technique is termed the "ball grid array" mounting technique, in which a pattern of closely positioned solder balls are used to provide a flip chip connection between the chip and a ceramic substrate module. However a major concern with the ball grid array package is solder joint reliability.

As is well known in mechanical engineering, a statically determinate member (one that is free to move) comprised of a homogenous isotropic material experiences a differential increase in length for a differential increase in temperature according to the mathematical relationship: $\delta_T = \alpha \Delta T L$, where $\delta_T$ is the differential increase in length of the member, $\alpha$ is the linear coefficient of thermal expansion, $\Delta T$ is the differential change in temperature of the member, and $L$ is the original length of the member. However, a statically indeterminate member whose thermal displacements are constrained does not change in length but instead becomes thermally stressed. It is well known that when two materials having a large mismatch between their thermal coefficients of expansion (TCE) are rigidly joined together, stresses and strains may develop in the combined structure.

This is important because there is a substantial difference in the TCE of various components of a flip chip bonding process. For example, the TCE of a semiconductor chip is typically 2.5 parts per million per degree Celsius (ppm/° C.). The TCE of a ceramic substrate module is typically in the range of 10–30 ppm/° C. A printed circuit (PC) board typically has a TCE of 14–20 ppm/° C.

The large difference in TCE between the different components may cause substantial thermal stress. For example, an unattached ceramic module with a TCE of 25 ppm/° C. and a length of 2 centimeter (cm) would expand by 30 microns for a 60° C. temperature rise. By way of comparison, an unattached chip would expand by only 3 microns over the same temperature rise. However, the chip is commonly bonded to the module by solder balls, which are substantially inflexible. Consequently, thermal stresses tend to develop at the solder joints. The thermal stresses may reduce the reliability of the solder connection. In particular, the lifetime of the solder connections may be substantially reduced as a consequence of variations in stress/strain caused by thermal cycling during normal chip operation.

A solder joint which is repetitively thermally cycled may eventually fail from the cumulative effects of multiple thermal cycles. Fatigue lifetime is commonly defined as the lifetime associated with the number of applied repeated stress cycles a material can endure before failure. Generally, the fatigue lifetime of solder joints decreases with increasing thermal stress on the solder joints during each thermal cycle. Thus, the fatigue lifetime will tend to decrease as the chip size is increased and/or the temperature swing increases, because these factors increase the thermal stresses. Fatigue lifetime tends to increase somewhat when comparatively soft solder joints are utilized. A comparatively soft solder, such as a 95% lead/5% tin solder, permits some limited flexure of the solder joint, which reduces thermal stresses at the solder joints compared with a hard, inflexible solder joint. However, even with comparatively soft solder connections, the solder joints are substantially inflexible compared to the large unmounted differential expansion of the chip and substrate over common temperature swings. Large thermal stresses will tend to occur at solder joints near the edges of the chip. Consequently, the fatigue lifetime may not be as large as desirable, particularly if the chip has a comparatively large area and is thermally cycled over a large temperature range.

One attempted solution to the thermal mismatch problem is the use of an intermediate interposer layer situated between the chip and the module. An interposer typically is comprised of an insulating layer and can be used to provide separate electrical connections between solder balls on the chip and solder balls on the ceramic module. A plurality of column-like electrical conductors are disposed through the interior of the insulating layer. The column-like conductors provide electrical connections between contact pads on opposite sides of the interposer. The contact pads may be bonded to corresponding contact pads on a chip and a ceramic substrate.

Interposers may favorably alter the stress and/or strain distribution between a chip and a module. For example, an interposer may be comprised of a material with a TCE matched to that of critical solder bumps. For this case the interposer layer has the same lateral displacement response with temperature as the solder bumps. Consequently, as the device heats up the critical solder bumps will not be stressed as severely as they would be if they were directly bonded to a material that had a substantially different TCE. Alternatively, the interposer may be comprised of a material with a TCE that is intermediate in value between that of the chip and the module such that the strain associated with the lateral displacement of the module and the chip is spread out over two sets of solder balls on the top and bottom of the interposer layer.

Interposers are commonly fabricated using conventional semiconductor patterning techniques. The interposer structure is typically comprised of an insulating material whose structure and thickness render it stiff enough to be processed using conventional semiconductor fabrication techniques and to permit registration to previously patterned features.

Interposers used in dense ball grid arrays, for example, may comprise a substantially flat dielectric material that substantially retains its shape during common fabrication process steps (e.g., photolithography, via hole definition, and metallization) such that contact pads and via holes may be patterned and plated on both sides of the interposer.

Commonly, interposers are comprised of a materials structure which is relatively inelastic. Although polymer films are sometimes used in interposers, typically the thickness of the polymer is comparatively thick such that substantial energy is required to achieve significant flexure of the film. Contact metals and vial hole interconnections may also further limit the transverse flexure of the interposer. In particular, some critical contact layers disposed on the surface of the interposer may include relatively low ductility metals. The low ductility metals may substantially limit the ability of the underlying insulating interposer film to flex. Also, the numerous via connections in the mounted interposer tend to "pin" the interposer film into place. Thus, the assembled structure comprised of the chip bonded to the module via the interposer comprises a substantially inflexible assembly of materials. Large thermal stresses will tend to develop as a result of the differences in TCE of the separate materials. While previously known interposers redistribute stresses caused by TCE mismatches, they do not provide a mechanism of strain relief. Consequently, the chip or module solder joints may become over stressed in device applications, such as modern computer chips, where there is substantial thermal cycling during ordinary use.

A desirable interposer structure would be compatible with the fabrication of a dense ball grid array using a high-yield fabrication process. The interposer would be of comparatively simple mechanical structure such that it could be manufactured inexpensively, with a high processing yield, and would be consistent with reliable solder joints. Additionally, the interposer structure would provide a strain relief mechanism to reduce the stress on solder joints.

What is desired is an interposer structure that permits reliable, low thermal-stress flip chip bonding of a semiconductor chip to a module.

SUMMARY OF THE INVENTION

The present invention comprises an interposer structure for making a low-stress electrical contact between a chip and a substrate having significantly different thermal coefficients of expansion. The interposer structure has bottom contact pads connected to conductive vias. Top contact pads are electrically coupled to the conductive vias by flexible conductive traces. A series of spaced cavities define flap-like regions between top and bottom contact pads which are substantially mechanically decoupled from the bulk interposer. The flap-like regions facilitate radial displacement of top and bottom contact pads by local flexure of the flap-like region and the flexible trace between top and bottom contacts. The effective elasticity in the flap-like regions is increased compared to the bulk interposer structure, permitting a relative lateral displacement of chip and substrate contacts to accommodate differences in thermal expansion between the chip and the substrate.

DETAILED DESCRIPTION OF THE INVENTION

Figure 1:
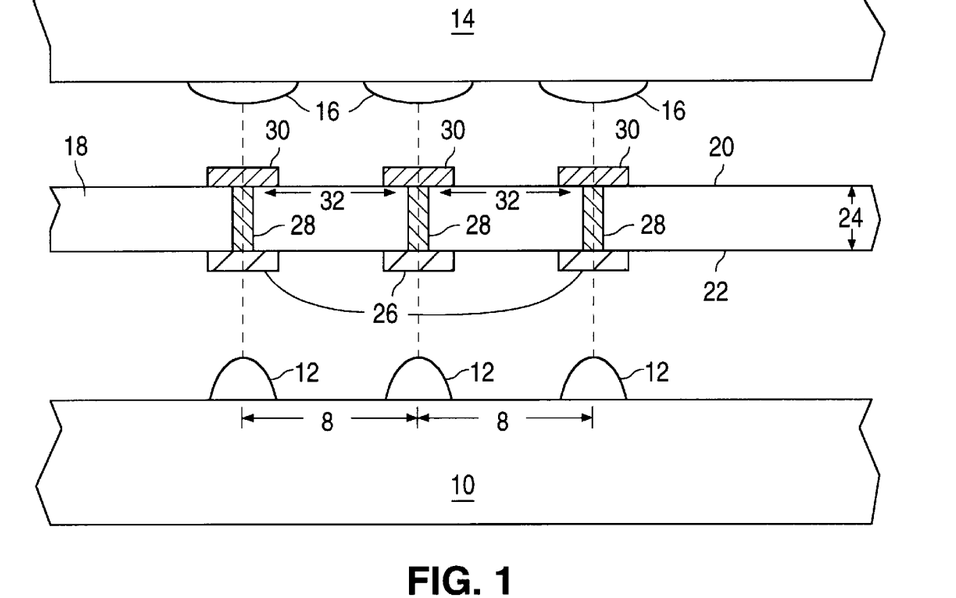
FIG. 1 is a side view diagram, not to scale, showing a conventional interposer to be mounted between a chip and a module.

The problems solved by the present invention may be illustrated with reference to FIG. 1. FIG. 1 is a side view diagram of a first illustrative interposer 18 which is inserted between a chip 10 and a substrate 14. The substrate may be comprised of a ceramic material. However, the substrate may comprise other materials which are being developed in the field of semiconductor packaging, such as a plastic material.

The chip 10 has a ball grid array of solder balls 12 disposed on the surface of chip 10. The substrate 14 has a corresponding ball grid array of solder balls 16 disposed on the surface of substrate 14. The interposer 18 is comprised of a thickness 24 of an insulating material disposed between chip 10 and substrate 14. Interposer 18 has a bottom surface 22 and bottom contact pads 26 dimensioned to contact with solder balls 12 on chip 10. Interposer 18 has conductive via connections 28 which permit an electrical contact to the top surface 20 of interposer 18. Interposer 18 also has top contact layers 30 connected to via connections 28. Top contact layers 30 are dimensioned to mate with solder balls 16 on substrate 14.

In a dense ball grid array configuration, the spacing 8 between solder balls 12 is comparatively small. Consequently, the inter-element spacing 32 between via holes 28 of interposer 18 must be reduced in a dense ball grid array configuration. Also, the surface area of top contact layers 30 and bottom contact layers 26 of interposer 18 must be correspondingly reduced to accommodate decreased solder spacing 8. Preferably, the vias 28 have a comparatively small diameter to facilitate a small inter-element spacing 32.

An interposer 18 may be fabricated using conventional semiconductor fabrication techniques. However, if the interposer 18 is to be used in a dense ball grid array, the fabrication tolerances become more stringent. The top surface 20 and bottom surface 22 of interposer 18 should remain substantially planar during the fabrication process (e.g., no substantial bowing) in order to facilitate photolithographic processes. Additionally, interposer 18 should not significantly change its dimensions during the fabrication process in order to facilitate proper alignment of top contact layers 30 and bottom contact layers 26.

These fabrication considerations substantially limit the choice of materials which may be used to form interposer 18, and also the thickness 24 of interposer 18 such that the bulk interposer is stiff enough to be readily fabricated. In addition to the inherent stiffness of the dielectric material comprising the interposer, the metal contact layers 26 and 30 may further increase the stiffness of interposer 18. This is particularly true if the metals utilized in contact layers 26, 30 are composed of comparatively low-ductility metals, such as nickel. Additionally, the effective elasticity may be further reduced when the interposer is mounted between a chip and a substrate. The inventors believe that even a comparatively flexible interposer material which is "pinned" between a plurality of via interconnections in its central region has a comparatively low effective elasticity. Thus, the inventors believe that the combination of the above-described physical mechanisms may result in an interposer structure that does not permit significant relative lateral displacement of module 14 with respect to chip 10 in response to a change in temperature. Consequently, the illustrative interposer structure of FIG. 1 may place excessive thermal stress solder balls 12 on chip 10 or solder balls 16 on substrate 14 such that the fatigue lifetime of the solder connections is lower than desired.

The inventors have recognized that thermal stresses may be reduced by designing an interposer to permit substantial lateral displacement in response to thermal variations. This requires designing an interposer in which it is energetically favorable for thermal displacement to occur.

Figure 2A:
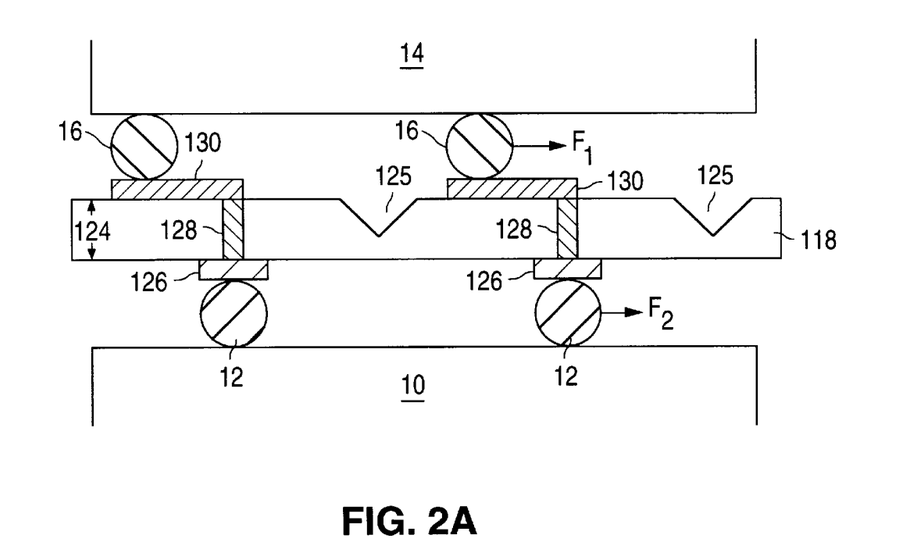
FIG. 2A is a side view of a segment of an illustrative inventive interposer in which additional slices in the interposer layer permit increased relative lateral displacement of corresponding top and bottom contact layers in localized areas.
Figure 2B:
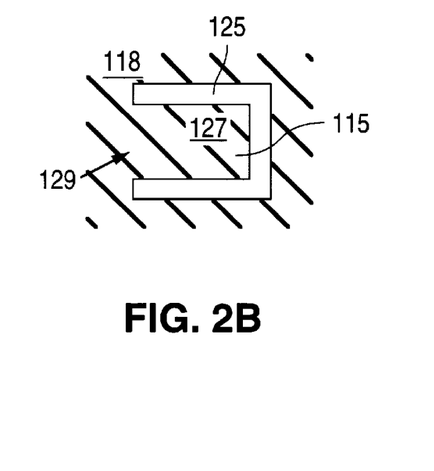
FIG. 2B is a top view of the illustrative interposer of FIG. 2A in which the slices extend through the interposer layer and define flap-like regions.

The present invention generally comprises an interposer structure in which localized regions of the interposer are substantially decoupled from the bulk interposer. This causes the effective elasticity to be increased in the localized regions. Thus, one aspect of the present invention is a means to substantially decouple localized regions from the bulk interposer. FIG. 2A is side view of an illustrative inventive multiple segment interposer 118 designed to permit a significant lateral displacement of substrate 14 with respect to chip 10 in response to a change in temperature. The top contact pads 130 and bottom contact pads 126 are not co-axial about the via hole 128, but instead are displaced relative to one another as shown in FIG. 2A. The top contact pad 130 extends some distance away from the via hole 128 such that solder ball 16 may be attached non-coaxially with solder ball 12. As shown in FIG. 2A, additional slices 125 are made in interposer layer 118, thereby forming multiple segments between the slices 125. As shown in FIG. 2B, slices 125 may extend substantially or completely through interposer 118 forming flap-like regions 127 which are substantially or entirely decoupled from the bulk interposer 118 along two or more sides. The flap-like regions 127 are segments which are decoupled from the bulk interposer along two or more sides (e.g., generally triangular or rectangular-shaped segments). The flap-like shape permits the flaps 127 to be stretched/compressed and/or bowed relative to the bulk interposer 118. Referring to FIG. 2B, the flap has a base region 129 and an end region 115. As described below in more detail, flexure of the flap 127 permits a displacement between the end region 115 and the base region 129 of the flap.

Referring to FIG. 2A, a solder ball 16 couples substrate 14 to top contact pad 130 while another solder ball 12 couples a corresponding bottom contact pad 126 to chip 10. If the device is instantly heated by a differential temperature amount, there would be a force $F_1$ at top solder ball 16 associated with the thermal expansion of substrate module 14. There would also be corresponding force $F_2$ at bottom solder ball 12 associated with the thermal expansion of the chip. The chip and module will move relative to one another until the forces are in equilibrium. Equilibrium will occur when the forces coupled by the deformed flap balances the forces from the chip and module.

A flap-like region which is substantially decoupled from the bulk interposer makes relative lateral displacement in response to temperature variations more energetically favorable. The energy required to substantially flex or bow localized regions, particularly flap-like regions 127, may be several orders of magnitude less than the energy required to change the transverse dimensions of a solid interposer layer 118. A flap greatly reduces the volume of material which must change shape. As an illustrative example, a flap encompassing one interconnection may correspond to an interposer flap with an area of 400 microns×400 microns. By way of comparison, a bulk interposer may encompass an area of 2 cm×2 cm, or an area several thousand times larger than a single flap. Also, slices 125 may provide for a variety of types of flexure. In addition to pure transverse motion, substantial bowing of localized areas may also occur.

The inventors have also realized that the material in the flap-region 127 may have a higher effective elasticity than other regions of the interposer if the flap 127 is not coated with a stiff metallization layer. For example, under bond metallurgy (UBM) metals used to make solder joints often have a comparatively thick nickel layer which serves as a diffusion barrier. However, nickel is a comparatively low ductility metal. The nickel layer used in UBM processes may be as thick as five microns, which substantially limits the flexure of a metallization layer. If the flap-region 127 does not have a stiff metallization layer it will tend to have a higher effective elasticity than other regions on the interposer which are coated with Ni or thick copper layers. Also, with the flap appropriately configured, it will encompass only one spaced-apart top and bottom interposer interconnection. Consequently, the flap will not be "pinned" by a plurality of via interconnections in the same way as the bulk interposer of FIG. 1.

However, while the illustrative inventive interposer of FIG. 2A illustrates the physical principles of the present invention, it is not based on the most advantagous fabrication method. A mechanical process to fabricate slices 125 would consume substantial areas on the interposer and would tend to be a low yield process. The slices 125 may excessively weaken the interposer 118 such as to make fabrication and bonding impractical. For example, a structure in which slices 125 extend through interposer 118 would lack structural integrity. Thermal expansion during a solder reflow processes may cause such a sliced interposer layer to warp and tear. An interposer with additional slices 125 through the interposer may also have its planarity and registration capability compromised during the heating process.

Figure 3A:
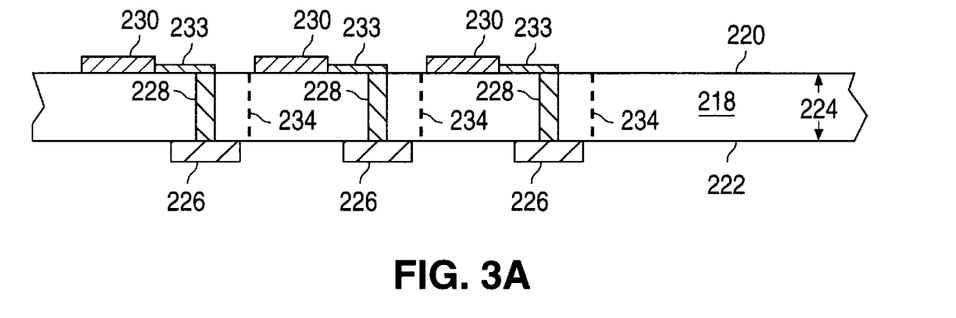
FIG. 3A is a side view diagram, not to scale, showing an interposer of the present invention with flap-like regions formed by perforations.
Figure 3B:
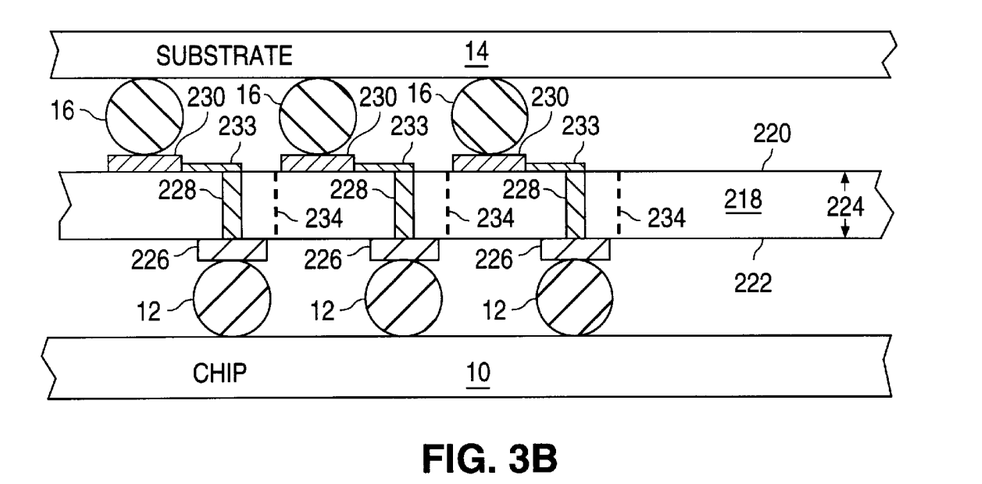
FIG. 3B is a side view diagram, not to scale, of the interposer of FIG. 3A situated showing the electrical connections that the interposer creates between solder bumps on a chip and a substrate.

The inventors have developed a high-yield fabrication process to fabricate an interposer with high-elasticity flaps which are substantially decoupled from the bulk interposer. FIGS. 3A and 3B are side view diagrams of an embodiment of the interposer of the present invention. As shown in FIG. 3A, the interposer 218 of the present invention includes flexible conductive traces 233 connecting top contact layers 230 to via conductors 228 and bottom contact layers 226. As shown in FIG. 3B, traces 233 spatially offset solder balls 12 on chip 10 from solder balls 16 on substrate 14. Additionally, interposer 218 includes spaced cavities 234. These spaced cavities 234 partially surround contact pad regions in a flap-like configuration to increase the effective elasticity of interposer 218 in highly stressed regions. The spaced cavities 234 comprise holes or grooves which extend substantially through the interposer. This reduces the area of material connecting the flap-like regions to the body of the interposer, which partially decouples the flap-like regions from the rest of the interposer. Also, as described below in more detail, in highly stressed regions the spaced cavities 234 may act like perforations such that the interposer tears along the spaced cavities 234 in response to high levels of stress, which further decouples flap-like regions from the bulk interposer.

Figure 4A:
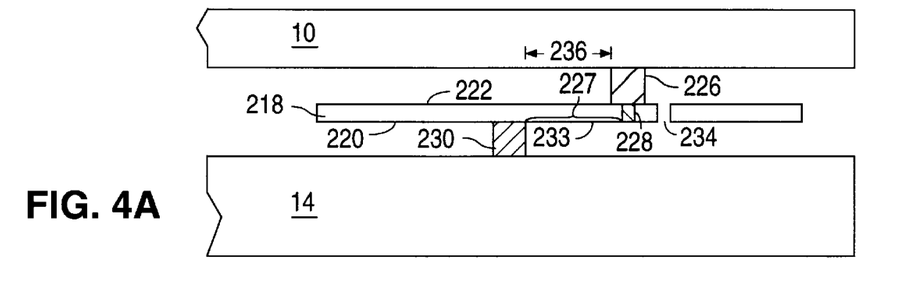
FIG. 4A is a side view diagram of the interposer of the present invention at a first operating temperature for which the interposer layer is substantially planar.
Figure 4B:
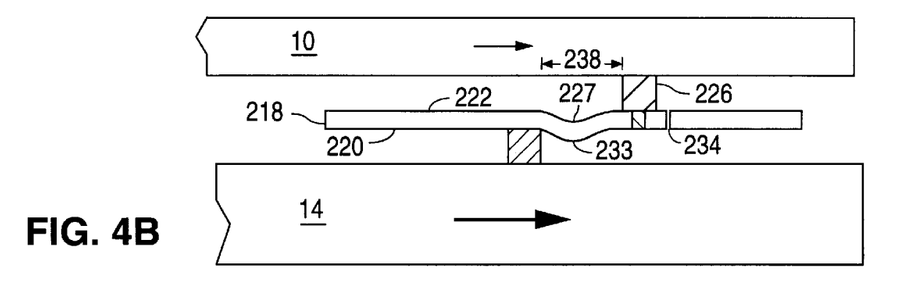
FIG. 4B is a side view diagram of the interposer of FIG. 4A at a second operating temperature for which the interposer layer bends in local regions to permit a relative lateral displacement between solder bumps on the chip and the substrate.

FIGS. 4A and 4B are side view diagrams of the interposer of the present invention during operation at two different temperatures. As shown in FIG. 4A, at a first temperature interposer 218 is substantially planar along its chip surface 222 and its module surface 220. However, as shown in FIG. 4B, at a second higher temperature interposer 218 is slightly bowed and flexed between chip contact 226 and module contact 230. This localized flexure in flap-like regions 227 permits chip contact 226 to be laterally displaced from module contact 230, thereby reducing the thermal stress on the solder contacts (not shown in FIGS. 3A and 3B). As shown in FIGS. 4A and 4B, the contact separation 238 at high temperature is less than the contact separation 236 at low temperature because localized flexure in flap-like regions 227 permits lateral displacement of the contacts on chip 10 and substrate 14. This mode of operation is made possible by flexible traces 233, which can distort in accordance with localized flexure of flap-like regions 227. The flap-like region 227 has a high effective elasticity since: 1) it is free of stiff metal layers; 2) it is at least partially decoupled from the bulk interposer by the perforations; and 3) the perforations provide additional room for the flap-like region 227 to flex. Additionally, as described below in more detail, spaced cavities 234 may expand in response to high levels of stress to form slice-like regions which completely decouple the flap-like regions 227 from the bulk interposer along at least two sides of the flap.

A variety of perforation configurations are consistent with the present invention. The spaced cavities 234 partially decouple flap-like regions from the rest of the interposer and thereby increase the effective elasticity in flap-like regions. The reduced area of material coupling the flap to the bulk interposer reduces the energy required to flex the flap. This reduces the energy costs of translating the flap by at least a factor of two (e.g., the effective elasticity is improved by at least a factor of two by virtue of the reduction in area of material connecting the flap to the interposer). For example, a series of perforations consisting of holes which are spaced by a separation distance which is less than about half of the hole length decouples the flap from the bulk interposer along more than one-half of the flap perimeter. Also, the spaced cavities 234 provide a small space for the flap to translate. For example, spaced cavities consisting of a series of 30 micron diameter holes which are spaced 30 microns apart provide an empty volume which facilitates several microns of flexure.

The inventors have also realized that the spaced cavities 234 may act as perforations which extend into slice-like regions 125 in response to high levels of stress/strain. Generally, a variety of materials structures tear along perforations in response to high levels of stress. This may be desirable to achieve a structure which is mechanically strong enough to be mounted into place but which forms completely decoupled flap regions subsequent to mounting.

Preferably the perforations are configured to define flap-like sections 227 which substantially decouple areas of the interposer in order to increase the effective radial elasticity between top contact pads 230 and bottom contact pads 226. It is desirable that the flaps permit 15 microns or more of lateral displacement to substantially eliminate thermal stresses on electrical connections when 2 cm×2 cm chips are operated over a 60° C. temperature swing. These parameters correspond to common computer chip applications. However, given the constant evolution of semiconductor technology, it may be desirable to further increase the potential lateral displacement for larger area chips and/or chips designed to be cycled over larger temperature swings.

Figure 5:
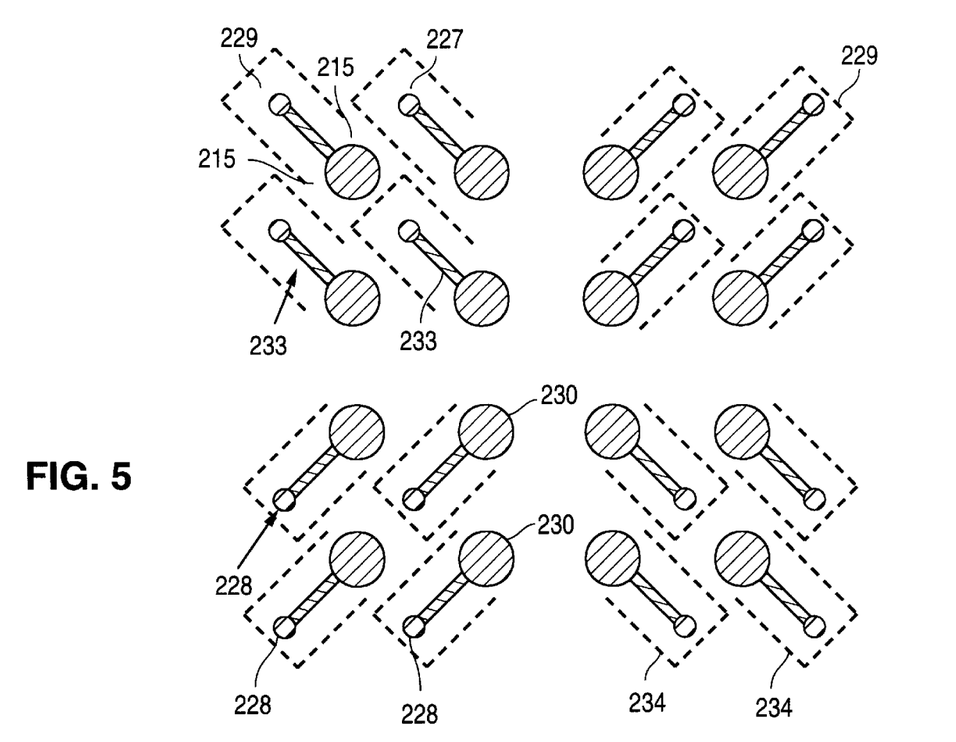
FIG. 5 is a top view of a first embodiment of the processed top surface structure of the interposer.

FIG. 5 shows a top view of an embodiment of the interposer of the present invention in which the perforations generally extend around the via and trace. As shown in FIG. 5, the top contact pads 230 are connected to bottom contact pads (not shown) by a trace 233 connecting top contact pads 230 to conductive via holes 228. The top contact pads 230 are patterned with the bottom contact pad radially separated from top contact by a length L, corresponding to the patterned length of the trace 233. The perforations are disposed around the trace 233 and via 228 in a generally U-shaped configuration which is radially aligned in the same direction as the trace 233. This defines a rectangular-shaped flap-region 227 of film with an end-region 229 disposed proximate to the via 228. The flap-region 227 has a base region 215 disposed proximate to contact 230. This flap-shaped section 227 of film may compress and/or flex to permit radial displacement of the top contact layer relative to the bottom contact layer. The elastic energy required to compress/stretch and/or bend a flap segment 227 is substantially reduced compared to that required to bend the entire connected film. As can be seen in FIG. 5, the trace 233 permits flexure of the flap 227 such that the top contact 230 may be displaced proximate to the via hole 228 and bottom contact 226.

Figure 6:
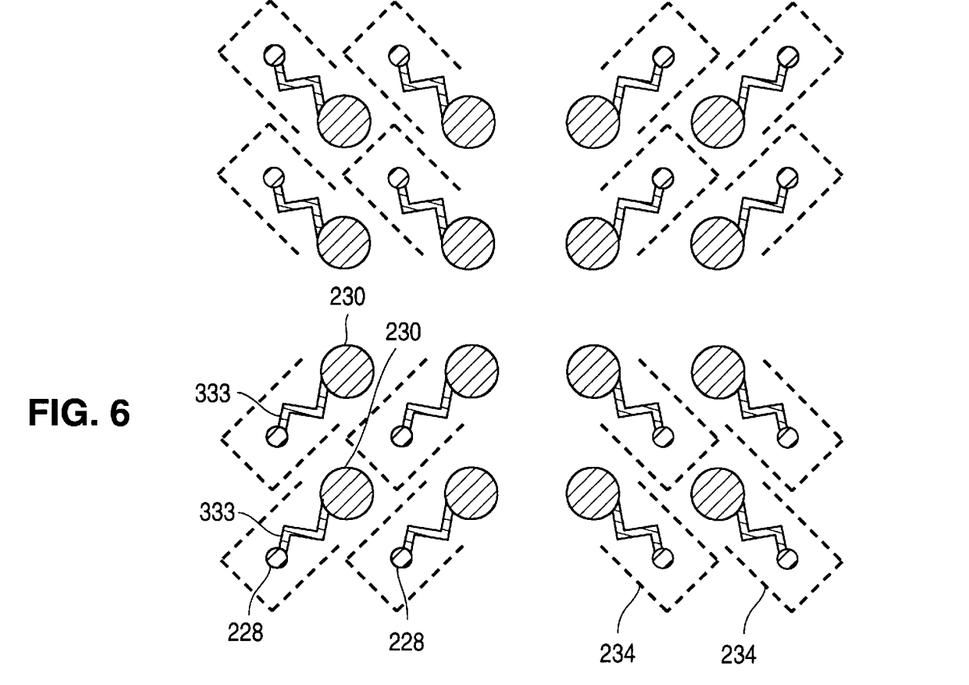
FIG. 6 is a top view of a second embodiment of the processed top surface structure of the interposer.
Figure 7:
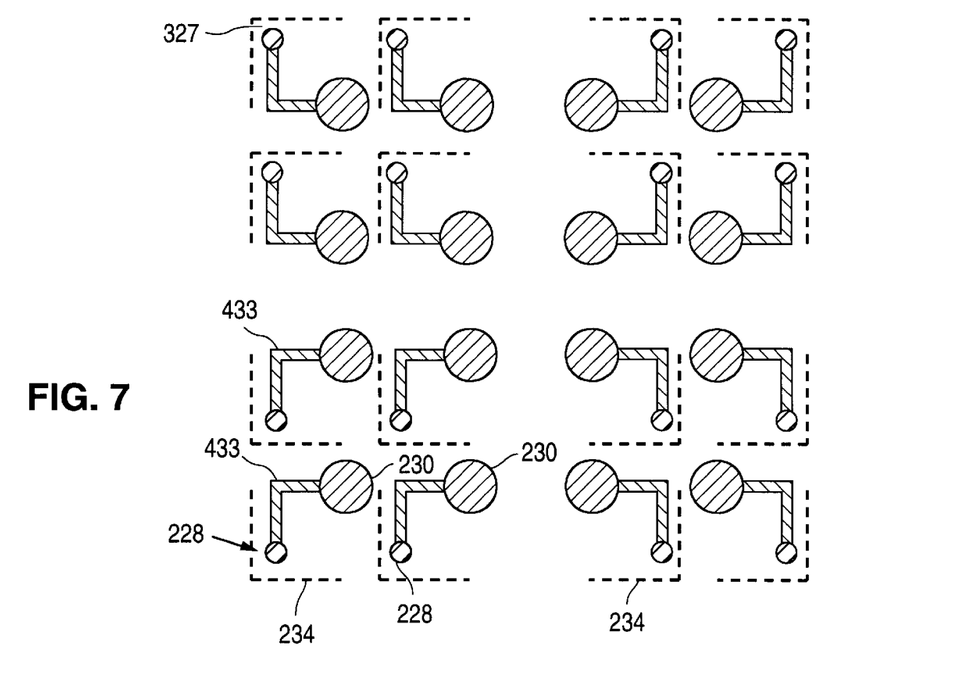
FIG. 7 is a top view of a third embodiment of the processed top surface structure of the interposer.
Figure 8:
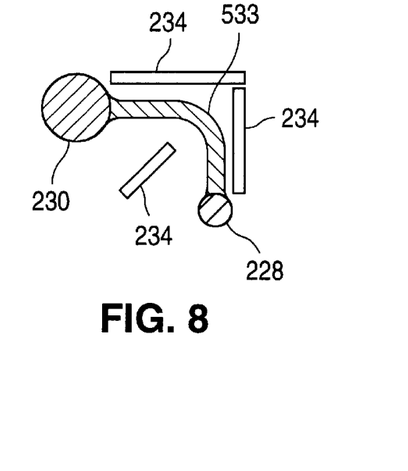
FIG. 8 is a top view of a fourth embodiment of the processed top structure of the interposer.

Variations on the inventive trace and flap design may facilitate the flexure of the trace and/or reduce stress at regions where the trace is electrically connected to the via or the top contact metallization. FIG. 6 shows an interposer structure similar to FIG. 5 except with serpentine trace leads 333. The serpentine trace leads 333 may permit greater flexure of the trace 333 compared to a linear trace between the same points. FIG. 7 is a top view of another embodiment of an interposer. In the figure, the spaced cavities 234 are arranged in a generally V-shape around the via to form a V-shaped flap 327. The L-shaped trace 433 permits a low-stress mode of transverse flexure between end regions of the trace 433, in analogy to the opening and closing of the ends of a safety pin. This may be desirable if comparatively thick trace metal layers are used. Other configurations are also possible. As further shown in FIG. 8, the spaced cavities 234 may be configured around the trace 433 in order to enhance both bowing and transverse motion. As shown in FIG. 8, by using a curved trace 533, the spaced cavities 234 may define perforations that are placed between the top contact and the via. This provides a displacement space which may facilitate radial movement between the top contact layer 230 and the via 228.

A variety of materials may be used to fabricate the interposer of the present invention. Preferably, the interposer is comprised of a flexible polymer film. The polymer film preferably has a high glass transition temperature, high temperature stability, a low modulus of elasticity, high elongation to break, and good adhesion to metals. These materials properties facilitate fabrication of the interposer and mounting the chip and substrate to the interposer. Suitable materials include benzocyclobutane (BCB) and flurocarbons (e.g., Teflon). However, polyimide is a preferred polymer film material because it can be conveniently obtained from commercial vendors in film thicknesses ranging between 12.5 microns to 50 microns in thickness.

Comparatively thin polyimide layers facilitate the processing of small diameter vias 228. Those skilled in the art are familiar with processes to form laser-drilled holes in thin polyimide films with hole diameters less than about 30 microns. Those skilled in the art are also familiar with the use of plasma etching and photo definable polymeric film techniques to fabricate via holes in polyimide films. Those skilled in the art are also familiar with techniques to fabricate conductive via holes, such as by electrodeposition techniques. Commonly, plated vias 228 have a surface metallization several microns greater in radius than the initial patterned hole itself.

Thin metal films can be readily deposited on polyimide films using a variety of techniques. Seed metals, such as Cr, may be deposited using sputtering and then Cu, Ni, or Au plated into pad regions. Additionally, polyimide processes may also use Cu foil lamination (e.g., polyimide films with thin copper foils laminated to the polyimide). A variety of well-known techniques to selectively strip metals, such as subtractive etching, are also compatible with the use of a polyimide film.

The flexible trace preferably has a length greater than about ten microns plus the maximum thermal mismatch displacement between a chip and a substrate for the outermost (corner) bumps. The ten micron distance corresponds to a small length of the trace which makes contact with a ten micron annulus contact pad around the plated via hole. Ten microns corresponds to a reasonable annular distance for well-known processing conditions. However, given the constant evolution of semiconductor processing techniques, somewhat smaller distances, corresponding to an annular contact pad around via hole 28, are also within the scope of the present invention.

The minimum trace length distance will depend upon the maximum thermal cycling of the mounted device, the size of the chip, and the thermal coefficient of expansion of the chip and the substrate. For example, with a 2 cm×2 cm chip (TCE=2.5 ppm/° C.) mounted to a PCB substrate (TCE=16 ppm/° C.) with a 65° C. thermal swing (e.g., from 20° C. to 85° C.), the thermal mismatch displacement corresponds to 17.23 microns. The trace is preferably long enough such that it may flex to accommodate a substantial portion of this thermal displacement. The trace may have to be substantially longer to account for the manner in which the polyimide film flap bows or flexes to accommodate a substantial portion (e.g., five to fifteen microns) of the 17.23 micron transverse thermal displacement of chip 10 and substrate 14. For example, as described below, it may be desirable to have a trace which is curved (i.e., not merely a direct straight line segment). Consequently, trace lengths in the range of 30 microns to 100 microns may be desirable.

The trace metal thickness should be chosen such that the trace may flex in conformity with the film. Those skilled in the art are familiar with soft metal alloy compositions and metal thicknesses which permit a substantial flexure. For example, it is well-known that a thin film of gold (e.g., less than one micron thick) is extremely compliant. Other ductile metal layers, such as a thin strip of copper, may also be used to form the flexible trace. Experiments by the inventors indicate that copper is sufficiently ductile such that a polyimide film with a trace less than about five microns thick may be readily flexed with a small radius of curvature. However, the inventors believe that traces with a copper film up to about 35 microns thick may also be useful for some applications. The upper limits on the metal film thickness may be selected using well-known principles of mechanics and materials science. For example, the flexure of a metal trace may be calculated using computer modeling based upon the cross-sectional area, length, and composition of the trace. Conversely, the minimum trace dimensions may be calculated to achieve a maximum electrical resistance (e.g., a fraction of an Ohm) using well-known techniques to calculate the electrical resistance as a function of the conductivity of the materials used and their dimensions.

The contact pad metallization layers may comprise commonly used metallization layers. Preferably, the dimensions of the contact pads is selected so that the interposer is consistent with a dense ball grid array. Contact pads less than about 150 microns in diameter are generally desirable for common ball grid array mounting schemes, which typically use solder balls less than about 150 microns in diameter (e.g., 125 microns).

The size and separation of the individual spaced cavities 234 that form the perforations will depend upon several factors. Preferably, the perforations are arranged such that slit-like openings develop along the perforations in highly stressed regions after the interposer is mounted. Techniques to experimentally measure or theoretically calculate the stress in a packaged device as a function of temperature are well known to those of ordinary skill in the art. (See, e.g., J. Lau, C. P. Wong, John L. Prince, and Wataru Nakayama, *Electronic Packaging: Design, Materials, Process, and Reliability*, McGraw-Hill (1998)). Those of ordinary skill in the art are also familiar with techniques to calculate sheer strains at which a polymer film will tend to deform and/or tear along a perforation. It is well-known that closely spaced perforation holes facilitate a smooth tear along the length of a perforation. Generally, the holes comprising perforations in common materials (e.g., plastic bags, cardboard, etc.) are not spaced apart more than about twice the length of each hole. Commonly, perforation holes are spaced at a distance approximately equal to the length of each hole to facilitate a clean tear. However, there are practical limitations to perforation designs which are consistent with an economical, dense ball grid array structure. This is because it is physically difficult to mechanically create holes substantially smaller than about 50 microns (2 mils) to laser drill holes substantially smaller than 20-to-30 microns in diameter.

In practicing the present invention, a packaging engineer would first select the materials structure and thickness of the interposer film. A comparatively thin film is preferable to reduce the energy required to flex localized areas (e.g., a less than about 100 micron thick polyimide layer, such as a 50 micron thick film). However, the film should be thick enough to facilitate a high-yield fabrication and mounting process. A technique to fabricate perforations should be chosen which is suitable for the materials structure (e.g., 20 micron diameter laser drilled holes or 50 micron mechanically punched holes for a comparatively thin polyimide film). The maximum sheer stress expected at the edge regions could be estimated using either computer modeling or empirical measurement techniques for a particular device (e.g., a silicon chip 2 cm×2 cm and having an operating temperature swing of 80° C.). The separation between the holes comprising a desired perforation could then be calculated and/or experimentally determined (e.g., empirically varying the spacing between 20 micron diameter laser drilled holes such that the film maintained its integrity prior to mounting but tore along the perforations in highly stressed regions).

There are several ways that the interposer of the present invention may be mounted to a chip and substrate. As described below in more detail, a mounting procedure is required to preserve the structural integrity of the interposer during the bonding process. Preferably, the mounting technique facilitates the registration of contact regions between the chip, interposer, and substrate. Large differences in the TCE of the chip, interposer, and substrate module can lead to differential expansion of the substrate at elevated mounting temperatures which hinder proper registration. Generally, it is well-known by those of ordinary skill in the art that a dimensional mismatch up to about one-half of the solder bump diameter at the mounting temperature is acceptable because the liquid solder will tend to wet contact pads which contact even part of a liquid solder ball. For example, a 130 micron solder bump permits about a 65 micron thermal displacement mismatch at the mounting temperature.

Those of ordinary skill in the art are presumed familiar with a variety of framing and prestressing techiques which facilitate the registration and mating of an interposer film with chips and substrates. For example, a polyimide film with a TCE of 40 ppm/° C. and which is 2 cm×2 cm in size expands by 132 microns when the film is raised in temperature from 20° C. to 185° C. This large thermal displacement may make it difficult to achieve registration to compact (e.g., less than about 150 micron in diameter) contact pads on the chip. One technique to prevent registration problems is to use a polyimide film with a comparatively low TCE. Low TCE materials, such as polyimide-2611 (manufactured by DuPont), may have a TCE as low as 4 ppm/° C. Consequently, the thermal displacement is reduced over the same temperature range to 13.2 microns. Another technique is to hold the polyimide film in a molybdenum frame during the mounting procedure. For example, the polyimide film can be attached to the frame in a prestressed condition at room temperature. During subsequent heating steps, the polyimide film will retain substantially the same dimensions during the bonding procedure, after which the frame can be removed. Another technique is to attach a polyimide film to a removable substrate, such as molybdenum substrate, which may be etched away after the polyimide film is attached to the chip.

Standard interposer connections, such as solder or epoxy contacts, may be made between contact pads on the interposer 18 and the chip 10 and substrate 14. For example, the conducting pads of the chip may be attached to pads on the interposer using low melting point tin and gold/tin solders. Alternatively, connections may be made using a conductive adhesive. Many conductive adhesives cure at temperatures less than 180 degrees° C. For example, the commercially available conductive adhesive known by the tradename EPOTECH E2101, available from Epoxy Technology, Inc. of Billerica, Mass., cures at a temperature of 160° C. However, since epoxies do not flow in the same manner as liquid solders, the mounting procedures should be adjusted (e.g., by using a low TCE film) to limit thermal expansion mismatch.

The sequence of mounting steps involves several tradeoffs. Some manufacturers prefer to mount the chip on an interposer first in order to test the connections to the chip. Other manufacturers prefer to mount the interposer to the module first, particularly in multi-chip module applications. The inventors believe that mounting the interposer to the chip first may be preferable in terms of maintaining the structural integrity of the interposer throughout the mounting process. The lower TCE of the chip, particularly if the interposer film has a comparable TCE (i.e., polyimide-2611) will tend to limit the thermal stresses to the interposer during a first step of solder-reflow or adhesive bonding. Mounting the interposer first to the substrate may cause higher stresses to be placed on the spaced cavities, particularly if there is a large temperature swing before the chip is mounted. This may be undesirable if it results in the spaced cavities perforating such that the structural integrity of the interposer is reduced prior to completion of the mounting process. However, if necessary, the interposer film thickness and spaced cavity spacing may be selected to increase the structural strength of the interposer during the mounting process. Also, since a variety of solders, epoxies, mounting frames, and thermal-cycle sequences are well-known to those of ordinary skill in the art, the mounting process may be further modified, if necessary, to facilitate mounting the interposer first to the substrate.

In summary, the inventors have realized that thermal stresses of solder joint connections may be reduced in an interposer by: 1) defining a flap-like region between top and bottom contact layers which is substantially mechanically decoupled from the bulk interposer by a series of spaced cavities; 2) substantially eliminating comparatively stiff metallization layers along the flap where flexure is to occur; 3) separating top and bottom contact layers relative to the flap such that lateral displacement may occur along the flap in response to thermal expansion; and 4) connecting top and bottom contact layers with a flexible conductive trace designed to permit substantial displacement of the flap while maintaining a continuous electrical connection between top and bottom contact metallization layers.

Although a preferred embodiment of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. An interposer to electrically couple contact pads of a chip and a substrate bonded on opposite sides of the interposer, comprising:

a substantially planar dielectric film having first and second opposing surfaces;

a first electrical contact pad disposed on the first surface of the film;

a second electrical contact pad disposed on the second surface of the film and laterally spaced apart from said first electrical contact pad;

a conductive via disposed in said film having a first end proximate the first surface and a second end proximate the second surface, the first end of said via electrically coupled to said first contact pad and the second end of said via electrically coupled to said second contact pad by a flexible conductive trace disposed on the second surface of the film; and a plurality of cavities disposed in said film, said cavities arranged to increase the effective elasticity of the interposer between said first and said second contact pads;

wherein a flexible region is formed between said first and second contact pads to enable transverse displacement of said first electrical contact pad relative to said second electrical contact pad.

2. The interposer of claim 1, wherein said flexible region is substantially physically decoupled from the dielectric film along at least two sides by a series of spaced cavities extending substantially through the dielectric film to form a flap.

3. The interposer of claim 1, wherein said trace is dimensioned to permit at least 15 microns of relative displacement.

4. The interposer of claim 2, wherein said cavities are shaped and spaced to perforate in response to thermal stresses in the mounted interposer to form the flap.

5. The interposer of claim 4, wherein said cavities and said trace are shaped and positioned to enable at least 15 microns of relative displacement between said first and second contact pads in the mounted interposer.

6. The interposer of claim 1, wherein said cavities extend from the first to the second side of said film.

7. The interposer of claim 1, wherein said flexible region is substantially free of non-ductile metal layers.

8. An interposer to electrically connect contact pads disposed on surfaces on opposite sides of the interposer, comprising:
a substantially planar dielectric film having first and second opposing surfaces;
a first electrical contact pad disposed on the first surface of the film, the electrical contact pad dimensioned to be attached to a chip contact pad;
a conductive via disposed in the film, and electrically coupled to the first electrical contact pad;
a second electrical contact pad disposed on the second surface of the film laterally spaced apart from said first contact pad;
a flexible electrically conductive trace disposed on the second surface of said film, the trace having a first end and a second end, the first end of said trace electrically coupled to said via and the second end of said trace electrically coupled to the second contact pad; and
a plurality of cavities in the film extending substantially through the film generally around the via and the trace, said cavities arranged to increase the effective elasticity of the interposer between said first electrical contact pad and said second electrical contact pad;
wherein a flexible region substantially free of non-ductile metal layers disposed between said first and second contact pads enables transverse displacement of said first contact pad relative to said second contact pad.

9. The interposer of claim 8, wherein the cavities are comprised of holes less than about 50 microns in diameter and with a spacing between holes that is less than twice the hole diameter.

10. The interposer of claim 9, wherein the holes have a diameter less than about 30 microns.

11. The interposer of claim 8, wherein the cavity size and spacing is selected such that the film is perforable along the cavities so that the film tears along the cavities in the mounted interposer in response to thermal stress.

12. The interposer of claim 11, wherein the perforations define a flap-like region.

13. The interposer of claim 12, wherein the flap-like region is shaped and positioned such that a torn flap in the mounted interposer enables at least 15 microns of relative transverse displacement between the first electrical contact pad and the second electrical contact pad.

14. A dielectric interposer which permits substantial relative radial displacement of the contact pads of a chip and a substrate bonded on opposing sides of the interposer, comprising:
a polyimide dielectric film less than about 100 microns thick having a first surface and a second surface;
a first electrical contact pad less than about 150 microns in diameter disposed on the first surface of the film, the electrical contact pad dimensioned to be attached to the chip contact pad solder ball;
a conductive via less than about 50 microns in diameter disposed in the film and electrically coupled to the first electrical contact pad;
a second electrical contact pad less than about 150 microns in diameter disposed on the second surface of the film laterally spaced apart a distance greater than the largest thermal displacement associated with the maximum thermal cycling of the chip, the second contact pad dimensioned to be attached to the substrate contact pad solder ball;
a flexible electrically conductive trace disposed on the second surface of the film, the trace having a first end and a second end, the first end of said trace coupled to said via and the second end coupled to the second contact pad; and
a plurality of cavities in said film extending substantially through said film generally around the via hole and the trace, said spaced cavities comprising a series of holes less than about 30 microns in diameter and separated from one another by a distance of less than about 60 microns, said cavities arranged to increase the effective elasticity of the interposer between said first electrical contact pad and said second electrical contact pad in a region between said contact pads;
wherein a flexible region substantially free of non-ductile metal layers disposed between said first contact pad and said second contact pad enables transverse displacement of said first contact pad relative to said second contact pad.

15. The interposer of claim 14, wherein the spaced cavities define flap-like regions.

16. The interposer of claim 15, wherein the flap-like regions comprise radially oriented flaps.

17. The interposer of claim 16, wherein the effective elasticity of the interposer layer in flap regions is increased by at least a factor of two compared to the dielectric film as a whole.

* * * * *